(12) United States Patent
Willmeroth et al.

(10) Patent No.: US 7,112,868 B2
(45) Date of Patent: Sep. 26, 2006

(54) IGBT WITH MONOLITHIC INTEGRATED ANTIPARALLEL DIODE

(75) Inventors: Armin Willmeroth, Augsburg (DE); Hans-Joachim Schulze, Ottobrunn (DE); Holger Huesken, München (DE); Erich Griebl, Dorfen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/698,082

(22) Filed: Oct. 30, 2003

(65) Prior Publication Data

US 2004/0144992 A1    Jul. 29, 2004

(30) Foreign Application Priority Data

Oct. 30, 2002   (DE) .................. 102 50 575

(51) Int. Cl.
*H01L 29/732*    (2006.01)
(52) U.S. Cl. .............. 257/578; 257/E29.037; 257/341; 257/143; 257/149
(58) Field of Classification Search ........ 257/341, 257/342, 143, 149, 152, 578, E29.036–E29.038, 257/502, 171, 138, 161, 147
See application file for complete search history.

(56) References Cited

U.S. PATENT DOCUMENTS

| | | | |
|---|---|---|---|
| 4,689,647 A * | 8/1987 | Nakagawa et al. ........ | 257/143 |
| 4,893,165 A | 1/1990 | Miller et al. | |
| 5,105,244 A | 4/1992 | Bauer | |
| 5,141,889 A | 8/1992 | Terry et al. | |
| 5,284,780 A | 2/1994 | Schulze et al. | |
| 5,475,243 A | 12/1995 | Saito | |
| 5,702,961 A | 12/1997 | Park | |
| 6,222,248 B1 | 4/2001 | Fragapane | |

(Continued)

FOREIGN PATENT DOCUMENTS

EP     0 330 122 B1    8/1989

OTHER PUBLICATIONS

Hajime Akiyama et al.: "Effects of Shorted Collector on Charateristics of IGBTS", *Proceedings of 1990 International Symposium on Power Semiconductor Devices and ICs*, Tokyo, 1990, pp. 131-136.

*Primary Examiner*—Kenneth Parker
*Assistant Examiner*—Matthew C. Landau
(74) *Attorney, Agent, or Firm*—Laurence A. Greenberg; Werner H. Stemer; Ralph E. Locher (57) ABSTRACT

An IGBT with monolithic integrated antiparallel diode has one or more emitter short regions forming the diode cathode in the region of the high-voltage edge. The p-type emitter regions of the IGBT have no emitter shorts. The counter-electrode of the diode exclusively comprises p-type semi-conductor wells on the front side of the device. Particularly in applications, such as lamp ballast, in which the diode of the IGBT is firstly forward-biased, hard commutation is not effected and the current reversal takes place relatively slowly. The emitter short regions may be strips or points below the high-voltage edge. The horizontal bulk resistance is increased and the snapback effect is reduced without reducing the robustness in the edge region. In a second embodiment, the IGBT is produced using thin wafer technology and the thickness of the substrate defining the inner zone is less than 200 μm. The thickness of the emitter region or of the emitter regions and short region(s) is less than 1 μm. A transparent emitter is preferable in this case.

9 Claims, 4 Drawing Sheets

U.S. PATENT DOCUMENTS

6,271,545 B1     8/2001  Schulze
6,323,509 B1 *  11/2001  Kusunoki ................... 257/146

2001/0040255 A1 *  11/2001  Tanaka ....................... 257/342

* cited by examiner

IGBT WITH MONOLITHIC INTEGRATED ANTIPARALLEL DIODE

BACKGROUND OF THE INVENTION

Field of the Invention

The invention relates to an IGBT (Insulated Gate Bipolar Transistor) with monolithic integrated antiparallel diode. That is, the invention relates to a device in which, lying on the front side of a semiconductor substrate—forming an inner zone—with semiconductor wells of a first conductivity type (p), there are transistor cells within a peripheral high-voltage edge. The semiconductor wells at least predominantly contain transistor cells. At least one emitter region of the first conductivity type (p) is disposed on the rear side of the semiconductor substrate, an electrode of the diode being formed in the form of at least one emitter short region of the second conductivity type (n) lying in the plane of the at least one emitter region.

An IGBT of this type is described for example in proceedings of 1990 International Symposium on Power Semiconductor Devices and ICs, Tokyo, on pages 131–36 under the title: "EFFECTS OF SHORTED COLLECTOR ON CHARACTERISTICS OF IGBTs" by J. Akiyama et al.

In the case of the IGBT described in that article, strip-type emitter (or collector) short regions are formed, which are rotated at an angle of 450 with respect to the likewise strip-type cell structure. The term emitter short regions, will be shortened to emitter shorts hereinafter.

Generally, the following possibilities are proposed for the realization of an IGBT with an antiparallel connected diode in the prior art:

(a) In a first concept, an IGBT and a diode are accommodated separately in a housing. This means that monolithic integration is not present. What is advantageous in this case, however, is that the respective technologies for the IGBT and the diode can be developed and optimized independently of one another. One disadvantage is that a larger chip area is necessary since the IGBT and the diode each require a high-voltage edge, in other words the latter has to be present twice. Moreover, the separate embodiment results in a larger mounting outlay and increased component rejects. Finally, also in the case of small chips if, in particular, the diode requires only a low current-carrying capacity, the minimum chip size is limited by the mounting and/or the radius of the high-voltage edge.

Figures 1A, 1B:
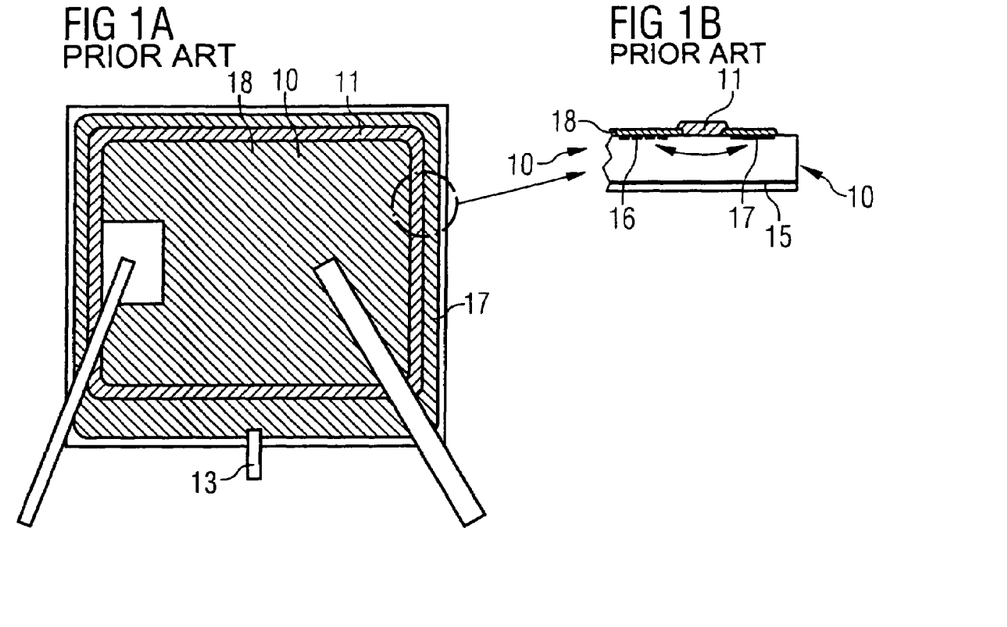
FIG. 1A is a plan view of a prior art IGBT.
FIG. 1B is a partial cross-sectional view of the prior art IBGT, showing the encircled detail of FIG. 1A.

(b) In a second concept for the realization of an IGBT with an antiparallel connected diode, the diode is integrated with a drift zone below the high-voltage edge of the IGBT. Such IGBT structures with an integrated antiparallel diode are described in U.S. Pat. Nos. 5,475,243 and 6,222,248. With reference to the drawing, FIGS. 1A and 1B show a plan view and, respectively, a detail illustration of a diagrammatic cross section of such an IGBT structure with an IGBT 10 having, below an upper metallization layer 18 made of aluminum, p-conducting regions 16 of transistor cells (IGBT cathodes), which form the anode of the diode, within a region. surrounded by an annular high-voltage edge 11. A p-conducting emitter 15 of the IGBT 10 is provided on the chip underside, and the n-conducting cathode 17 of the diode is located outside the high-voltage edge 11 and forms an anode emitter. In order to connect the latter to collector potential, a bonding wire 13 from outside the high-voltage edge 11 connects the latter to a lead frame. A double arrow indicates the course of the diode current. The advantage of concept (b) is the monolithic integration of the diode, only one high-voltage edge being required. One disadvantage, particularly in the case of large chips, is that the diode can only conduct small currents on account of the ratio of edge length to diode area. Furthermore, the additional bonding wire 13 is necessary, which increases the mounting outlay.

Figure 2A:
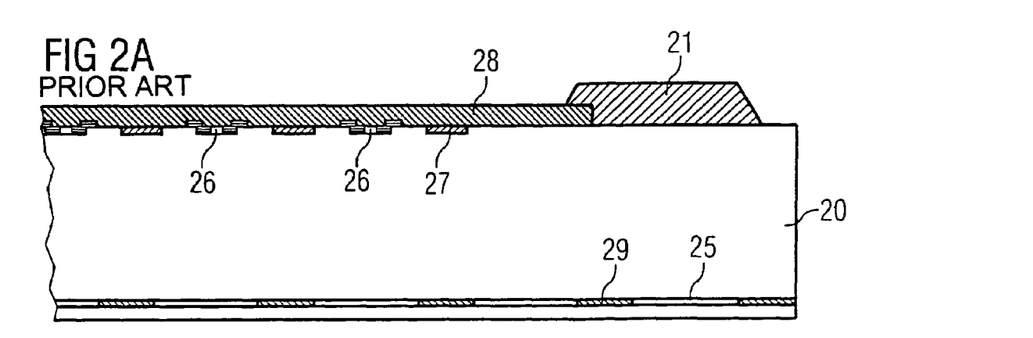
FIG. 2A is a cross section through a further prior art IGBT.
Figure 2B:
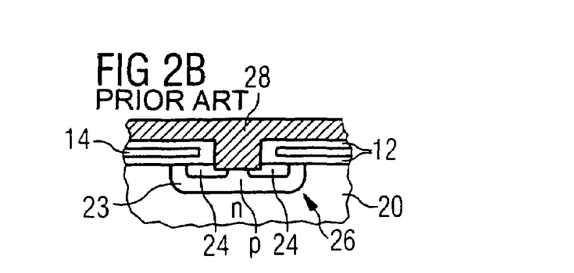
FIG. 2B is a cross section through a detail of the prior art IGBT shown in FIG. 2A.

(c) In a third concept, the antiparallel connected diode is realized in an interruption of the p-conducting emitter on the chip underside in an integrated manner. This embodiment can also be combined with specially configured diode regions on the front side of the chip. Such a known configuration—as it is outlined in the introductory text above—with an "emitter shorting" that has already been customary for a relatively long time in the case of thyristors (in this respect, see also U.S. Pat. Nos. 6,271,545 B1, 5,284,780; 5,105,244; 5,702,961; and 5,141,889) is explained in the above-mentioned document: "EFFECTS OF SHORTED COLLECTOR ON CHARACTERISTICS OF IGBTs" and is illustrated in FIGS. 2A and 2B. In the top side of a chip 20, transistor cells 26 and diode cells 27 (the latter optional) alternately lie below a metallization 28 and an insulating layer 12 (not specifically illustrated in FIG. 2A). The transistor cells 26 are constructed in the customary manner shown in FIG. 2B and comprise, in the n-conducting inner zone of the chip 20, a p-conducting well or body zone 23, an n-conducting source zone 24 and a gate electrode 14. The entire rear side of the chip is covered by alternate strip-type p-conducting emitters 25 of the IGBT and by strip-type n-conducting emitter shorts 29. Advantages of this concept (c) consist in the monolithic integration and in practically arbitrary adjustability of the current-carrying capacity of the diode in relation to the current-carrying capacity of the IGBT. One disadvantage, however, is that a larger chip area is necessary in order to achieve equally good collector-emitter voltages Vce in the case of saturation, since the emitter shorts do not emit and their area proportion is practically lost for IGBT operation. A further disadvantage consists in a pronounced "snapback" characteristic after switch-on from 0 V, particularly in the realization of a field stop device. There is a further disadvantage in the form of the rear-side phototechnique which has to be performed in order to form the emitter shorts and in which the emitter shorts additionally have to be aligned with respect to the front side of the IGBT diode.

SUMMARY OF THE INVENTION

It is accordingly an object of the invention to provide an IGBT with a monolithic integrated antiparallel diode which overcomes the above-mentioned disadvantages of the heretofore-known devices and methods of this general type and which, inter alia, is particularly suitable for a comparatively low diode current-carrying capacity.

With the foregoing and other objects in view there is provided, in accordance with the invention, an IGBT with a monolithically integrated antiparallel diode, comprising:

a semiconductor substrate forming an inner zone and having a front side, a rear side, and a peripheral high-voltage edge;

the front side of the semiconductor substrate having semiconductor wells of a first conductivity type formed therein with transistor cells within the peripheral high-voltage edge;

at least one emitter region of the first conductivity type formed at the rear side of the semiconductor substrate;

at least one emitter short region of a second conductivity type integrated substantially only in a region of the high-voltage edge, the at least one emitter short region lying in a plane with the at least one emitter region and forming an electrode of the antiparallel diode;

the at least one emitter region having no emitter short regions within the high-voltage edge; and the semiconductor wells on the front side of the semiconductor substrate forming a counterelectrode of the antiparallel diode.

In other words, according to the first aspect of the invention, an IGBT of the generic type is characterized in that the emitter short region(s) is or are integrated only in the region of the high-voltage edge, so that the emitter regions have no emitter shorts within the high-voltage edge, and in that the counterelectrode of the antiparallel diode is exclusively formed by semiconductor wells on the front side of the chip.

In an exemplary embodiment of the IGBT according to the invention, the emitter short region(s) may reach across the high-voltage edge toward the outside as far as the chip end in the edge regions of the IGBT.

In a preferred exemplary embodiment of the IGBT according to the invention, all the emitter regions are integrated in contiguous fashion, and the emitter short regions are formed in insular fashion.

The emitter short regions may be integrated in strip-type fashion, for example in the form of annular strips which annularly surround a contiguous inner emitter region. In this case, the strips may also run obliquely, for example at an angle of 30°, with respect to the high-voltage edge. In another example, all the emitter short regions may be integrated in punctiform fashion. In this case, a multiplicity of punctiform emitter short regions may annularly surround a central emitter region which is integrated in contiguous fashion. As an alternative, it is also possible for just one or two emitter short regions to be integrated in punctiform fashion. It goes without saying that other configurations of the emitter short regions with regard to the emitter region are also possible.

In an alternative embodiment of the invention, the emitter region and the at least one emitter short region having a thickness of less than 1 micrometer and the emitter region having a doping with a dose of between $1 \cdot 10^{12}$ and $1 \cdot 10^{15}$ charge carriers per $cm^2$.

An IGBT of this type can be produced in thin wafer technology (see European patent EP 0 330 122 B1, which describes an IGBT with a transparent emitter). Given this form of realization of the IGBT according to the invention, the inner zone formed by the substrate is less than 200 μm thick.

The emitter short region(s) may also be integrated in a manner not aligned with respect to the transistor cells. This applies, of course, to emitter shorts of arbitrary configuration, that is to say, for example, to strip form and to point form.

Preferably, in the IGBT structure corresponding to the second aspect of the invention, a field stop region of the second conductivity type is integrated between the substrate forming the inner zone and the emitter region(s) and the emitter short region(s).

In an exemplary embodiment of the IGBT according to the invention, the first conductivity type is the p-conductivity type and the second conductivity type is the n-conductivity type.

In an IGBT according to the invention, the substrate forming the inner zone is weakly doped, and the emitter region(s) is or are doped with a significantly higher doping concentration than the inner zone.

The IGBT according to the invention can advantageously be used particularly where the required current-carrying capacity of the diode is less than that of the IGBT. Examples of this are lamp ballast applications and SMPS applications (SMPS=Switched Mode Power Supply). In this case, the high current-carrying capacity of the IGBT, which is achieved with a smaller silicon area and significantly lower production costs in comparison with a MOSFET, is combined with the advantages of the antiparallel connected integrated diode which forms an integrated backward diode of the MOSFET.

Once more in summary, there is provided an IGBT with monolithic integrated antiparallel diode, in which the diode cathode is formed by at least one emitter short region which basically lies exclusively in the region of the high-voltage edge. Accordingly, the p-type emitter regions of the IGBT essentially have no emitter shorts. According to the invention, the counterelectrode of the diode exclusively comprises p-type semiconductor wells on the front side of the device. Particularly in applications, such as lamp ballast, for example, in which the diode of the IGBT is firstly forward-biased, hard commutation is not effected and the current reversal takes place relatively slowly, the emitter short regions may be embodied as strips or as points below the high-voltage edge. These measures increase the horizontal bulk resistance and thereby reduce the snapback effect in an IGBT without reducing the robustness in the edge region. In accordance with a second aspect, an IGBT with an integrated antiparallel diode according to the invention can be produced using thin wafer technology with which the thickness of the substrate defining the inner zone is less than 200 μm and the thickness of the emitter region or of the emitter regions and of the emitter short region(s) is less than 1 μm. A transparent emitter is preferable in this case.

Other features which are considered as characteristic for the invention are set forth in the appended claims.

Although the invention is illustrated and described herein as embodied in an IGBT with monolithic integrated antiparallel diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3A:
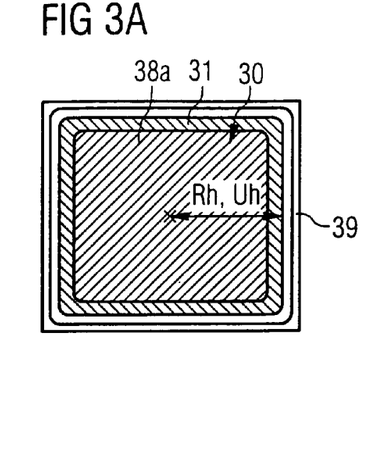
FIGS. 3A and 3B respectively show a plan view and a diagrammatic cross section of a first exemplary embodiment of an IGBT according to the invention.
Figure 3B:
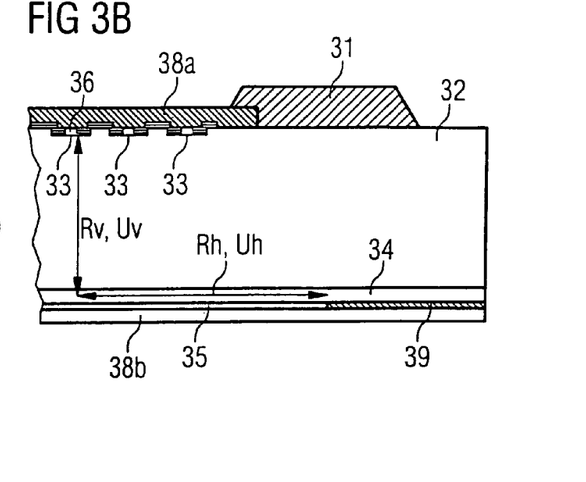

Referring now once more to the figures of the drawing in detail and, particularly, to FIGS. 3A and 3B thereof, there is shown a first exemplary embodiment of an IGBT 30 with monolithic integrated antiparallel diode according to the invention. Lying on the top side of a substrate 32—forming a weakly doped n-conducting inner zone—next to one another there are transistor cells 36 arranged in strip-type fashion, for example, in each case within p-conducting wells 33. The transistor cells 36 are constructed in the same way as the transistor cells 26 (cf. FIG. 2B). However, it is not absolutely necessary for all the wells 33, like the wells 23, to contain source zones and thus form transistor cells 36. Rather, it is also possible to provide individual wells 33 without source zones. The active region of the IGBT is covered with a metal layer 38a and surrounded on the outside by an annular high-voltage edge 31 toward the chip edge. A p-conducting emitter region 35 is arranged on the rear side of the IGBT. The p-conducting emitter region 35 is extended right into the region below the high-voltage edge 31. An electrode of the monolithic integrated antiparallel diode is formed in the form of an n-conducting emitter short region 39, which preferably adjoins the emitter region 35 as far as toward the outer edge of the device. This emitter short region 39 extends only in the region of the high-voltage edge 31, and the emitter regions 35 have no emitter shorts, as is shown in FIG. 3B. The counterelectrode of the diode is exclusively formed by the semiconductor wells 33 on the front side of the chip. However, these wells 33 need not all have source zones. Rather, it suffices for the predominant part of the counterelectrode to be formed by semiconductor wells with a source zone. In this case, "predominant part" is understood to be 80% of the area of the counterelectrode or more, and preferably 90% of said area or more.

The emitter short region 39 may extend beyond the high-voltage edge 31 as far as the edge of the device, thereby obviating the need for precise alignment. The emitter region 35 may, at least partly, also be extended into the region of the high-voltage edge 31 of the component (cf. FIG. 3B), so that, in this way, this region also contributes to raising the concentration of free charge carriers in the forward-biased state of the IGBT. However, in order, in the reverse-biased state, to reduce the anodal gain factor in the region of the high-voltage edge 31 of the IGBT and to be able to better deplete the free charge carriers, the emitter short region 39 reaches as far as the edge of the device, as has already been mentioned above.

FIG. 3A shows a point X located at the center of the device. The horizontal bulk resistance Rh from the point X to the emitter short region 39 is significantly larger compared with the known IGBT described in the introduction with reference to FIG. 2. As the forward voltage rises, the IGBT triggering voltage Uv of 0.7 V is first reached at the point X, the current/voltage characteristic of the device snapping back from the MOS characteristic to the IGBT characteristic (snapback point in accordance with FIGS. 5A and 5B). The distance between the point X and the emitter short region 39 should be particularly large in order that triggering is effected at the lowest possible current.

An $n^+$-conducting field stop zone 34 possibly present between the substrate 32, on the one hand, and the emitter regions 35 and the emitter short region(s) 39, on the other hand, reduces the horizontal bulk resistance and thus increases the triggering current required for achieving the triggering voltage of 0.7 V. The higher the doping concentration in the field stop zone 34, the greater the effect of increasing the triggering current.

Figure 4A:
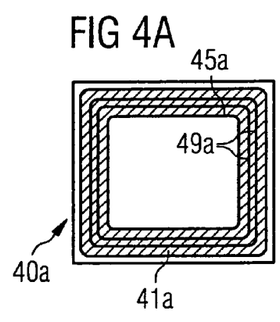
FIGS. 4A, 4B, 4C, 4D, 4E, and 4F respectively show plan views of six further alternative exemplary embodiments of an IGBT according to the invention.
Figure 4B:
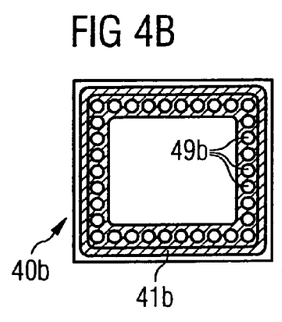
Figure 4C:
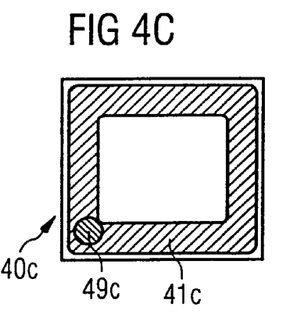
Figure 5A:
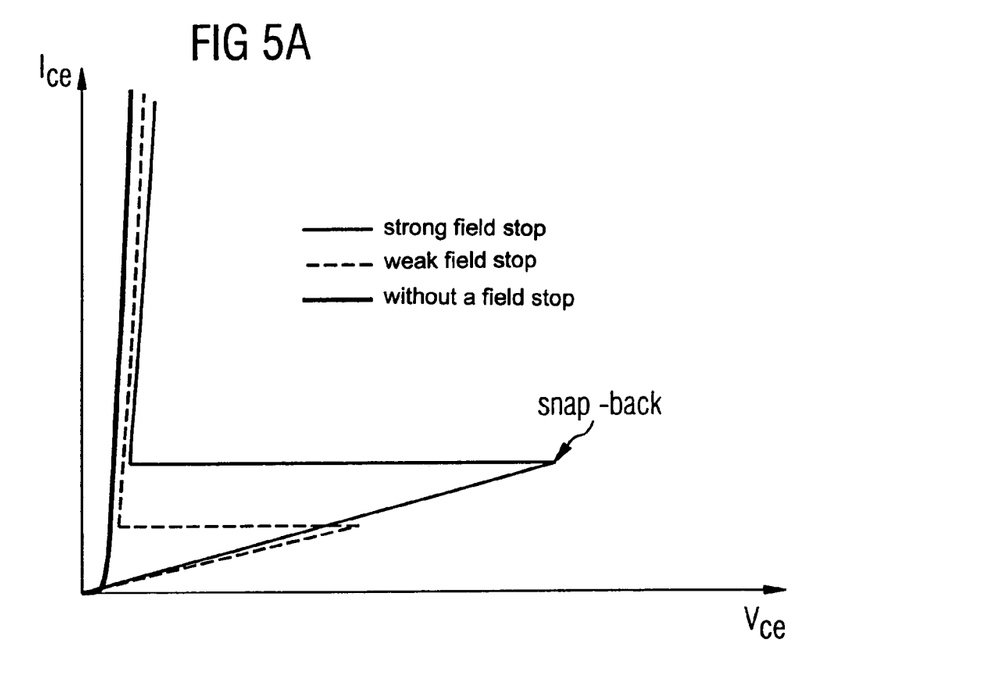
FIGS. 5A and 5B are graphs plotting the behavior of the collector current as a function of the collector voltage, on the one hand in the case of a forward-biased IGBT with high emitter shorting in each case with a strong field stop, weak field stop and without a field stop, and, on the other hand, in the case of a forward-biased IGBT with a field stop in each case with a small short distance, with a large short distance and without an emitter short.
Figure 5B:
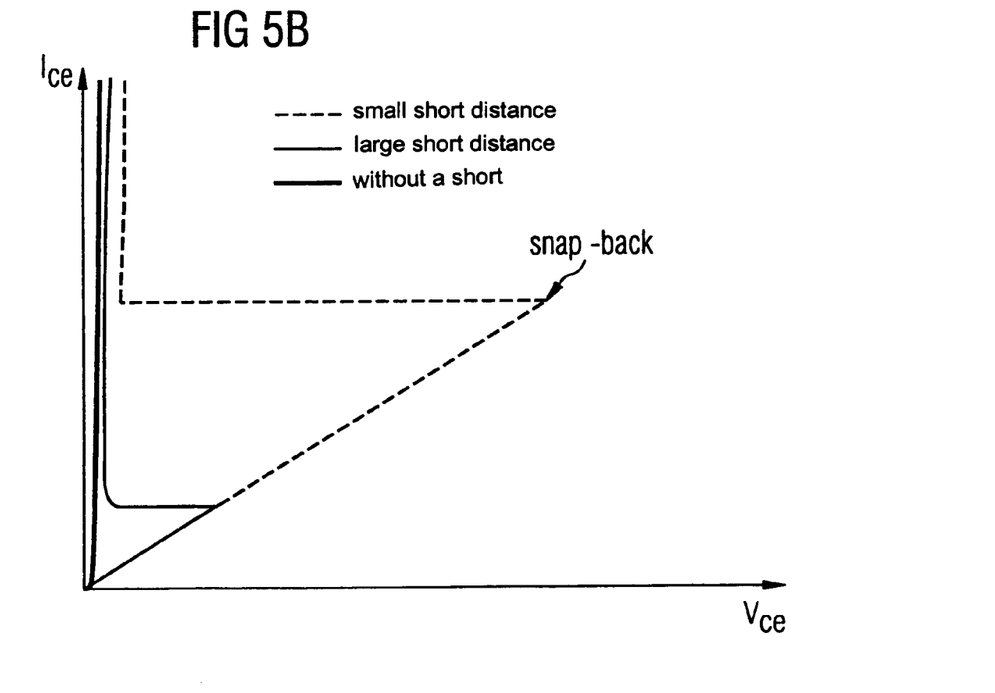

FIGS. 5A and 5B illustrate the snapback behavior of IGBTs with an integrated diode, to be precise on the basis of the $I_{CE}/V_{CE}$ forward characteristics ($I_{CE}$=collector-emitter current; $V_{CE}$=collector-emitter voltage) of an IGBT with high emitter shorting in FIG. 5A, the thin solid characteristic applying to a transistor with a strong field stop, the dashed characteristic applying to a transistor with a weak field stop and the thick solid characteristic applying to a transistor without a field stop. It is evident that the snapback effect is most pronounced in the case of an IGBT with a strong field stop. The $I_{CE}/V_{CE}$ forward characteristics in FIG. 5B show how the snapback effect can be reduced by means of the measures proposed by the invention. An IGBT with a field stop is taken as a basis, and the thin solid forward characteristic shows that the snapback effect becomes smaller, the larger the short distance, that is to say the distance between the emitter short region 39 and the point X (cf. FIGS. 3A, 3B and also FIGS. 4A–4C, yet to be explained).

In the case of the IGBT 30, it is possible to realize one or more of the following features according to the invention which are used to avoid the disadvantages of area loss and pronounced snapback characteristic which occur in the prior art:

(a) No additional diode regions are situated on the side of the IGBT emitter region 35. Only the built-in short circuits between the n-conducting emitter short regions 39 and the p-conducting wells 33 in the top side of the device are utilized for the current flow through the diode.

(b) The distance between diode region and IGBT region that is prescribed as a design rule in the prior art is dispensed with.

(c) The n-conducting emitter short regions 39, that is to say the diode cathode regions, are exclusively integrated in the region below the high-voltage edge 31.

(d) Regions below the high-voltage edge 31 may also contain p-conducting emitter regions 35 in addition to the n-conducting emitter short regions 39.

(e) For rapid triggering propagation in the IGBT region, all the p-conducting emitter regions 35 of the chip are contiguous. In other words, the n-conducting emitter short regions 39 are insular.

(f) The arrangement of the n-conducting emitter short regions need not be aligned with respect to the IGBT cells.

There are applications, for example the lamp ballast application mentioned above, in which firstly the diode is forward-biased and is not subjected to hard commutation, the current reversal being effected relatively slowly. In this case, the MOS channel of the IGBT is usually switched on whilst still in diode operation. In this case, the charge carriers injected in diode operation are useful for the switching operation because they reduce the switch-on overvoltage of the IGBT and thus the snapback effect. In the case of an IGBT according to the invention as illustrated in FIG. 3B, the introduction of the emitter short regions 39 solely in the region of the high-voltage edge 31 improves the triggering properties of the IGBT in comparison with a chessboard-like or strip-type introduction of emitter short regions (cf. FIG. 2). The reason for this is the larger distance between the point X and the emitter short region 39 or the emitter short regions in comparison with the chessboard-like or strip-type emitter short regions 29, and the larger horizontal bulk resistance which results from this. The effect of the increased bulk resistance has already been explained above.

Furthermore, the already described measure of the p-conducting emitter region 35 also being extended into the region of the high-voltage edge 31 of the component in order thus for this region, too, to contribute to raising the concentration of free charge carriers in the forward-biased state of the IGBT, contributes to an additional minimization of the forward voltage Vcsat in the switched-on state. In order, in the reverse-biased state, to reduce the anodal gain factor in the region of the high-voltage edge 31 of the IGBT 30 and to better deplete the free charge carriers, according to the invention the n-conducting emitter short regions 39 may reach as far as the edge of the device in this region.

FIG. 4A shows a further exemplary embodiment of an IGBT 40a according to the invention. Here, a plurality of, for example two, annular strip-type emitter short regions 49a running parallel are formed below a high-voltage edge 41a. As has been mentioned above with reference to FIG. 3B, p-conducting emitter regions 45a may also lie in the region of the high-voltage edge 41a of the IGBT 40a.

FIG. 4B shows a further exemplary embodiment of an IGBT 40b according to the invention. Below a high-voltage edge 41b, a multiplicity of punctiform n-type emitter short regions 49b are arranged annularly on the rear side of the device.

FIG. 4C shows a further exemplary embodiment 40c of an IGBT according to the invention with a single punctiform n-type emitter short region 49c below the high-voltage edge 41c. The distance and thus the bulk resistance Rh with respect to the point X are maximized by this singular arrangement of the emitter short region 49c in a corner of the chip.

Figure 4D:
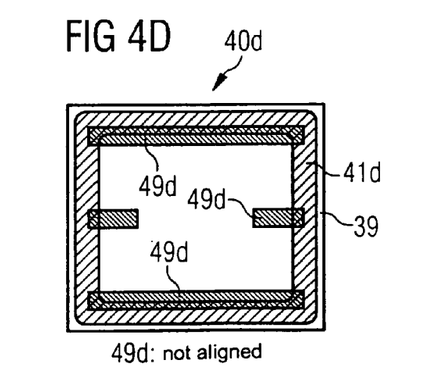
Figure 4E:
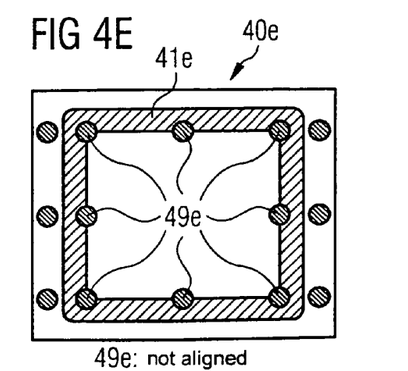
Figure 4F:
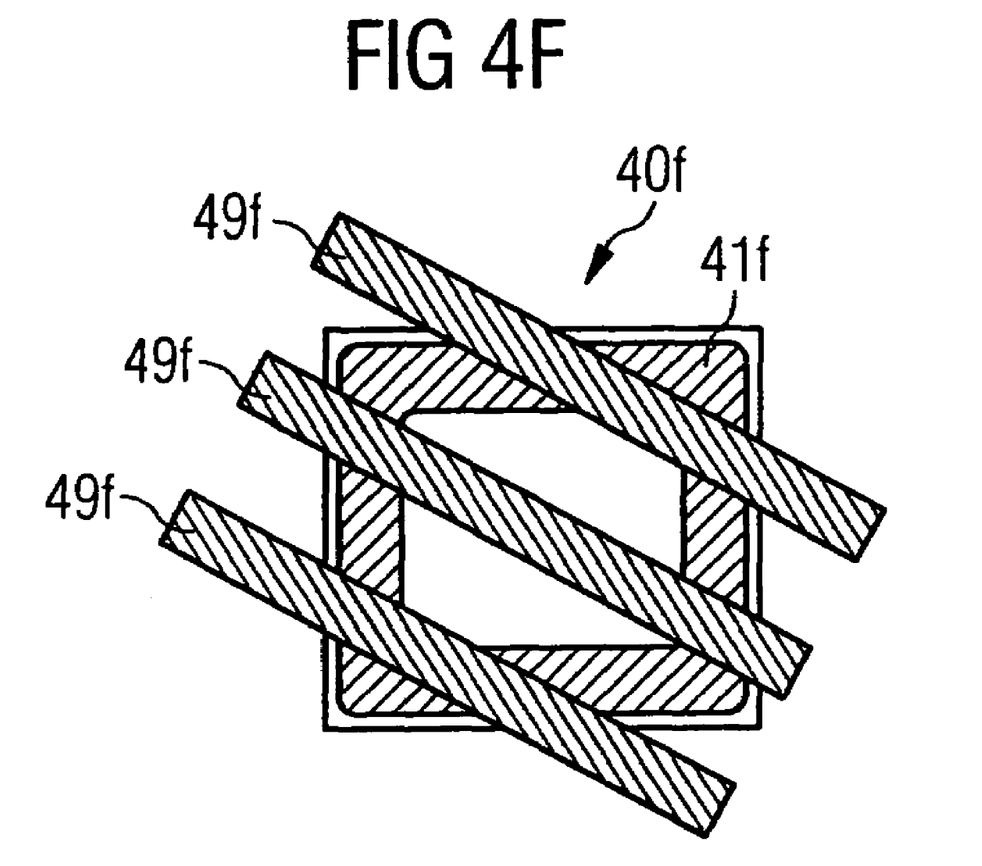

FIGS. 4D, 4E and 4F illustrate further exemplary embodiments of an IGBT 40d and 40e and 40f, respectively, according to the invention, in which emitter short regions 49d, 49e and 49f are integrated in a manner not aligned with respect to the transistor cells lying on the top side of the chip. In this case, in FIG. 4D the emitter short regions 49d are integrated in a non-aligned manner in strip-type fashion, and in FIG. 4E the emitter short regions 49 are integrated in a non-aligned manner in punctiform fashion.

FIG. 4F shows an exemplary embodiment, similar to FIG. 4D, with strip-type emitter short regions 49f. These emitter short regions 49f run obliquely at an angle of 30°, for example, with respect to the high-voltage edge 41f.

Consequently, in the case of an IGBT with a monolithic integrated antiparallel diode according to the invention, the geometry can thus be adapted to special requirements, in particular for applications in which firstly the diode is forward-biased, hard commutation is not effected and the current reversal takes place relatively slowly (such as, for example, when using the IGBT in lamp ballast applications). Simultaneously utilizing the IGBT cells as diode anode reduces the area required. Furthermore, restricting the diode n-type emitter shorts to the edge region of the device increases the horizontal bulk resistance without reducing the increase in the robustness in the edge region. If the diode does not have to have a high current-carrying capacity, the emitter short may be positioned in a chip corner, so that the horizontal bulk resistance is maximized (cf. FIG. 4C).

In accordance with a second aspect, an IGBT with an integrated antiparallel diode according to the invention may be produced using thin wafer technology in which the thickness of the substrate defining the inner zone is less than 200 μm and the thickness of the emitter region or of the emitter regions and of the emitter short region(s) is less than 1 μm. The emitter regions are then doped with a dose of between $1 \cdot 10^{12}$ and $1 \cdot 10^{15}$ cm$^{-2}$ charge carriers, the lifetime of the minority charge carriers in the substrate 32 being at least 10 μs. Annealing is performed after the implantation at temperatures of less than 600° C. For the rest, the IGBT according to this second aspect may be constructed in the same way as the above-described IGBTs of FIGS. 3A, 3B and 4A to 4E.

A so-called transparent emitter is present in the case of the IGBT according to the second aspect. In the case of this IGBT produced using thin wafer technology, a field stop region 34 is particularly advantageous in order to reduce the flow of a so-called "tail current" and thus to shorten the separation time.

The conductivity types specified in the exemplary embodiments described above may also be reversed in each case. Thus, it is also possible, for example, for a p-conducting substrate to be used as a basis. Besides silicon, by way of example, silicon carbide, compound semiconductors, etc. may be chosen as the semiconductor material for the substrate.

We claim:

1. An IGBT with a monolithically integrated antiparallel diode, comprising:
   a semiconductor substrate forming an inner zone and having a front side, a rear side, and a peripheral annular high-voltage edge;
   said front side of said semiconductor substrate having semiconductor wells of a first conductivity type formed therein with transistor cells within said peripheral annular high-voltage edge, said peripheral annular high-voltage edge being provided on said front side of said semiconductor substrate;
   at least one emitter region of the first conductivity type formed at said rear side of said semiconductor substrate;
   at least one emitter short region of a second conductivity type integrated substantially only in a region of said high-voltage edge, said at least one emitter short region lying in a plane with said at least one emitter region and forming an electrode of the antiparallel diode, said at least one emitter short region extending as far as a chip end in edge regions of the IGBT;
   said at least one emitter region having no emitter short regions within said high-voltage edge;
   said at least one emitter region having a thickness of less than 1 micrometer and a doping with a dose of between $1 \cdot 10^{12}$ and $2 \cdot 10^{15}$ charge carriers per cm$^2$;
   said semiconductor wells on said front side of said semiconductor substrate forming a counterelectrode of the antiparallel diode; and
   a distance between a point located at the center of the IGBT and said at least one emitter short region being maximized for triggering the IGBT at a lowest possible current.

2. The IGBT according to claim 1, wherein said semiconductor wells at least predominantly contain transistor cells.

3. The IGBT according to claim 1, wherein edge regions of the IGBT contain one or more emitter regions at said high-voltage edge.

4. The IGBT according to claim 1, wherein a lifetime of minority charge carriers in said semiconductor substrate is at least 10 μs.

5. The IGBT according to claim 1, wherein a thickness of said inner zone formed by said substrate is less than 200 µm.

6. The IGBT according to claim 1, which comprises a field stop region of the second conductivity type integrated between a first region including said substrate and a second region including said emitter region and emitter short region.

7. The IGBT according to claim 1, wherein said substrate forming said inner zone is weakly doped, and said emitter region is heavily doped with a significantly higher doping concentration than said inner zone.

8. The IGBT according to claim 1, wherein said at least one emitter region is annealed at a temperature of less than 600° C.

9. The IGBT according to claim 1, wherein the first conductivity type is the p-conductivity type and the second conductivity type is the n-conductivity type.

* * * * *